(12) United States Patent
Nakajima

(10) Patent No.: US 6,503,671 B1
(45) Date of Patent: Jan. 7, 2003

(54) ELECTRON BEAM WRITING METHOD

(75) Inventor: Ken Nakajima, Tokyo (JP)

(73) Assignee: NEC Corporation, Tokyo (JP)

( * ) Notice: Subject to any disclaimer, the term of this patent is extended or adjusted under 35 U.S.C. 154(b) by 80 days.

(21) Appl. No.: 09/676,847

(22) Filed: Sep. 29, 2000

(30) Foreign Application Priority Data

Oct. 5, 1999 (JP) .......................................... 11-284512

(51) Int. Cl.$^7$ .............................. G03F 9/00; G03C 5/00
(52) U.S. Cl. ...................... 430/30; 430/296; 430/942
(58) Field of Search ........................... 430/30, 296, 942

(56) References Cited

U.S. PATENT DOCUMENTS

| | | | | |
|---|---|---|---|---|
| 5,667,923 A | 9/1997 | Kanata | ........................ | 430/30 |
| 5,856,677 A | 1/1999 | Okino | ................... | 250/492.22 |
| 6,117,600 A | * 9/2000 | Nakasuji | ..................... | 430/30 |

FOREIGN PATENT DOCUMENTS

| JP | 7-106216 | 4/1995 |
|---|---|---|
| JP | 8-236428 | 9/1996 |
| JP | 8-264411 | 11/1996 |
| JP | 9-180978 | 7/1997 |

* cited by examiner

*Primary Examiner*—Christopher G. Young
(74) *Attorney, Agent, or Firm*—Hayes Soloway PC

(57) ABSTRACT

An electron beam lithography apparatus includes (a) an electron beam source emitting an electron beam, (b) a wafer stage on which a wafer is to be mounted and which is horizontally movable, (c) a horizontally movable mask located above the wafer stage, the electron beam passing through the mask and reaching the wafer, the mask having areas in each of which a divisional pattern is formed, the divisional pattern being obtained by dividing a pattern to be written, in accordance with an area density, and (d) a controller which controls a speed of at least one of the mask and the wafer stage for each of the areas in accordance with the area density. The electron beam lithography apparatus can make it possible to compensate for the proximity effect in each of the areas of the mask, ensuring to write a minute pattern with high accuracy.

10 Claims, 6 Drawing Sheets

///// : EXPOSED STRIPE AREA

ELECTRON BEAM WRITING METHOD

BACKGROUND OF THE INVENTION

1. Field of the Invention

The invention relates to an electron beam writing method, an electron beam lithography apparatus which is called a SCALPEL apparatus, and a mask used in such an electron beam writing method and an electron beam lithography apparatus.

2. Description of the Related Art

An electron beam lithography system makes it possible to write a pattern of 0.2 μm or smaller which pattern could not be written by a light-exposure system. Hence, an electron beam lithography system had drawn attention as a technology for accomplishing a smaller size and higher performance of a semiconductor device.

However, an exposure system for exposing a plurality of wafers to an electron beam at a time has not been established so far in a field of an electron beam lithography system. Hence, though an electron beam lithography system makes it possible to write a minute pattern, it was not possible to fabricate a mass of semiconductor devices at a time.

In recent years, an electron beam lithography system in which an apparatus for exposing a plurality of wafers to an electron beam at a time is used has been suggested and put into practice for the purpose of enhancement in throughput, as a semiconductor device has been designed to have a greater area and fabricated in higher integration.

Such an electron beam lithography system makes it possible to enhance fabrication yield in a large-scale integration circuit (LSI) such as a dynamic random access memory (DRAM) including a plurality of memory cells, by preparing a mask having a pattern of memory cells, and irradiating an electron beam through the mask.

The electron beam lithography system is contemplated as a substitution of a conventional light-exposure system.

However, there occurs the proximity effect in the electron beam lithography system like in the conventional light-exposure system. Herein, the proximity effect is defined as an effect wherein a pattern is influenced with respect to a size and a shape by neighboring patterns.

For instance, when a pattern of a couple of micrometers is to be formed by the electron beam lithography system, an electron beam irradiated onto a pattern is backwardly scattered due to molecules constituting a resist and a substrate, and hence, reaches an area of a resist remote from a location at which the electron beam was irradiated onto the resist, resulting in that it is not possible to form a pattern as designed. Herein, backward scattering is generally indicated as a characteristic length βb.

Hence, many attempts have been made to compensate for the proximity effect by controlling electron beam irradiation such that electron energy directed to an edge of a pattern is kept constant.

One of the methods of compensating for the proximity effect includes the steps of observing neighboring patterns around patterns to be written, defining a rule table for deformation of a mask pattern in dependence on the neighboring patterns, and sizing the patterns to be written, with reference to the rule table, based on information about arrangement of a pattern. This method can deal with wide patterns of a semiconductor device.

However, this method is accompanied with a problem as follows. In this method, the mask is scanned at a constant rate as high as possible, and all patterns are exposed to a light for enhancing fabrication yield. Namely, the same amount of electron beam irradiation is applied to all patterns. Hence, even if the patterns are accurately sized, there is a limitation in writing a minute pattern with high accuracy, only by sizing the patterns.

The scanning rate may be set smaller to avoid the problem. However, there is caused another problem that fabrication yield is much deteriorated.

As mentioned so far, the conventional electron beam lithography system is accompanied with a problem that the proximity effect cannot be compensated for, even if electron beam irradiation or a scanning rate is varied. Hence, even if a minute pattern has to be formed in a local area, since the proximity effect cannot be compensated for, it would not be possible to form a pattern with high accuracy.

Apart from the above-mentioned method, various attempts have been made to compensate for the proximity effect.

For instance, Japanese Unexamined Patent Publication No. 7-106216 has suggested a method of compensating for the proximity effect, including the step of varying a scanning speed of electron beams.

In the suggested method, a deflection rate of electron beams is varied to thereby compensate for the proximity effect. However, the method is accompanied with a problem that it is unavoidable for an electron beam lithography system to have a too complicated structure.

Japanese Unexamined Patent Publication No. 8-264411 has suggested an electron beam lithography system and a method of compensating for the proximity effect in electron beam lithography.

The suggested system is designed to include a plurality of electron beam sources, an aperture, and means for overlapping electron beams relative to each other such that a current distribution of the electron beams on the aperture has a predetermined uniformity or profile.

However, this system is accompanied with a problem that it is quite difficult or almost impossible to make the current distribution to have a desired uniformity.

Japanese Unexamined Patent Publication No. 9-180978 has suggested a method of compensating for the proximity effect in electron beam lithography.

In the suggested method, there is used a mask partitioned into a plurality of small areas each having a width sufficiently smaller than a width of a profile of backwardly scattered electrons. Each of the small areas is formed with an aperture through which an electron beam passes, and is designed to have a size defined by subtracting a predetermined aperture area from an area of a non-exposed part of a wafer in a region associated with each of the small areas of the mask.

However, according to experiments conducted by the inventor, it was impossible to write a minute pattern with high accuracy by the above-mentioned method.

SUMMARY OF THE INVENTION

In view of the problems of the conventional electron beam lithography, it is an object of the present invention to provide an electron beam writing method which makes it possible to write a minute pattern with high accuracy and enhance a fabrication yield.

It is also an object of the present invention to provide an electron beam lithography apparatus which can do the same.

It is another object of the present invention to provide a mask suitable for the above-mentioned method and apparatus.

In one aspect of the present invention, there is provided an electron beam writing method including the steps of (a) preparing a mask having areas in each of which a divisional pattern is formed, the divisional pattern being obtained by dividing a pattern to be written, in accordance with an area density, and (b) irradiating an electron beam onto a wafer through the mask such that a different amount of irradiation of electron beam is applied through each of the areas of the mask.

In accordance with the above-mentioned method, it is possible to optimize electron beam irradiation for each of the divisional patterns formed in each of the areas of the mask. Hence, it would be possible to compensate for the proximity effect in each of the areas, ensuring that a minute pattern can be written with high accuracy.

In addition, by selecting an optimal scanning rate, a scanning rate might be increased in some of the areas. As a result, a fabrication yield can be enhanced in those areas.

Furthermore, the method can be carried out at low cost, and can be readily carried out in practical use.

For instance, the step (b) may be carried out by varying a rate at which a stage on which the mask is mounted is moved, or by varying a rate at which a stage on which the wafer is mounted is moved.

It is preferable that the areas are arranged in a line in the mask, and the wafer is reciprocating across each of the areas in the step (b).

Since the wafer can be exposed to electron beams while the wafer is reciprocating, it would be possible to shorten a cycle time necessary for writing a pattern, ensuring enhancement of a fabrication yield.

It is preferable that a divisional pattern in every second area among the areas is formed as a reflected image relative to an original divisional pattern, in which case, it is preferable that the wafer is moved in a direction opposite to a direction in which the mask is moved.

It is preferable that the mask is moved reciprocally within each of the areas in the step (b).

It is preferable that the areas arranged in a line have divisional patterns to be scanned in the same direction.

It is preferable that each of the areas is shaped in a square having a side length of Y/2 wherein Y indicates a backscattering diameter in a double Gaussian distribution model equation.

It is preferable that the mask has first to third areas in each of which first to third divisional patterns are formed, respectively, the first to third areas being arranged in a line in this order, the second divisional pattern being formed as a reflected image relative to an original divisional pattern, and the step (b) may further include the steps of (b1) moving the mask in a first direction and the wafer in a second direction for exposing the third area with an electron beam, the first and second directions being opposite to each other, (b2) moving the mask in the first direction and the wafer in the first direction for exposing the second area with an electron beam, and (b3) moving the mask in the first direction and the wafer in the second direction for exposing the first area with an electron beam.

It is preferable that the areas are repeatedly arranged in a group in the mask, the areas in a group having the same set of divisional patterns.

It is preferable that a divisional pattern in every second area among the areas in each group is formed as a reflected image relative to an original divisional pattern.

In another aspect of the present invention, there is provided an electron beam lithography apparatus including (a) an electron beam source emitting an electron beam, (b) a wafer stage on which a wafer is to be mounted and which is horizontally movable, (c) a horizontally movable mask located above the wafer stage, the electron beam passing through the mask and reaching the wafer, the mask having areas in each of which a divisional pattern is formed, the divisional pattern being obtained by dividing a pattern to be written, in accordance with an area density, and (d) a controller which controls a speed of at least one of the mask and the wafer stage for each of the areas in accordance with the area density.

It is preferable that the controller sets a smaller speed of at least one of the mask and the wafer stage for the area having a greater area density.

It is preferable that the areas are arranged in a line in the mask, and the controller moves the wafer reciprocally across each of the areas.

It is preferable that a divisional pattern in every second area among the areas in the mask is formed as a reflected image relative to an original divisional pattern.

It is preferable that the controller moves the mask reciprocally within each of the areas.

It is preferable that the areas arranged in a line in the mask have divisional patterns to be scanned in the same direction.

It is preferable that each of the areas in the mask is shaped in a square having a side length of Y/2 wherein Y indicates a backscattering diameter in a double Gaussian distribution model equation.

It is preferable that the controller moves the wafer stage in a direction opposite to a direction in which the mask is moved.

It is preferable that the mask has first to third areas in each of which first to third divisional patterns are formed, respectively, the first to third areas being arranged in a line in this order, the second divisional pattern being formed as a reflected image relative to an original divisional pattern, in which case, the controller (d1) moves the mask in a first direction and the wafer stage in a second direction when the third area is to be exposed with an electron beam, the first and second directions being opposite to each other, (d2) moves the mask in the first direction and the wafer stage in the first direction when the second area is to be exposed with an electron beam, and (d3) moves the mask in the first direction and the wafer stage in the second direction when the first area is to be exposed with an electron beam.

It is preferable that the areas are repeatedly arranged in a group in the mask, the areas in a group having the same set of divisional patterns.

It is preferable that a divisional pattern in every second area among the areas in each group is formed as a reflected image relative to an original divisional pattern.

In still another aspect of the present invention, there is provided a mask used in electron beam lithography, having areas in each of which a divisional pattern is formed, the divisional pattern being a pattern obtained by dividing a pattern to be written, in accordance with an area density.

In accordance with the above-mentioned mask, it is possible to optimize electron beam irradiation for each of the divisional patterns formed in each of the areas. Hence, it would be possible to compensate for the proximity effect in each of the areas, ensuring that a minute pattern can be written with high accuracy.

It is preferable that the areas are arranged in a line in the mask.

This arrangement ensures the mask to move only in a direction when a wafer is to be exposed to an electron beam through the next area of the mask. Thus, it would be possible to shorten a cycle time, ensuring enhancement of a fabrication yield.

It is preferable that a divisional pattern in every second area among the areas is formed as a reflected image relative to an original divisional pattern.

This arrangement makes it possible that the mask is successively moved in a scanning direction, and the wafer is successively reciprocating while being exposed to an electron beam. As a result, it would be possible to reduce a time necessary for the wafer to move, ensuring enhancement of a fabrication yield.

It is preferable that the areas arranged in a line have divisional patterns to be scanned in the same direction.

It is preferable that each of the areas is shaped in a square having a side length of Y/2 wherein Y indicates a backscattering diameter in a double Gaussian distribution model equation.

It is preferable that the areas are repeatedly arranged in a group in the mask, the areas in a group having the same set of divisional patterns.

It is preferable that a divisional pattern in every second area among the areas in each group is formed as a reflected image relative to an original divisional pattern.

The advantages obtained by the aforementioned present invention will be described hereinbelow.

In accordance with the present invention, it is possible to optimize electron beam irradiation for each of the divisional patterns formed in each of the areas of the mask. Hence, it would be possible to compensate for the proximity effect in each of the areas, ensuring that a minute pattern can be written with high accuracy.

In addition, the present invention makes it possible to effectively move the mask and/or the wafer, ensuring enhancement of a fabrication yield.

Furthermore, the present invention can be carried out at low cost, and can be readily carried out in practical use.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Hereinbelow is explained an electron beam writing method in accordance with the first embodiment.

First, hereinbelow is explained a mask used in the method.

Figure 1:
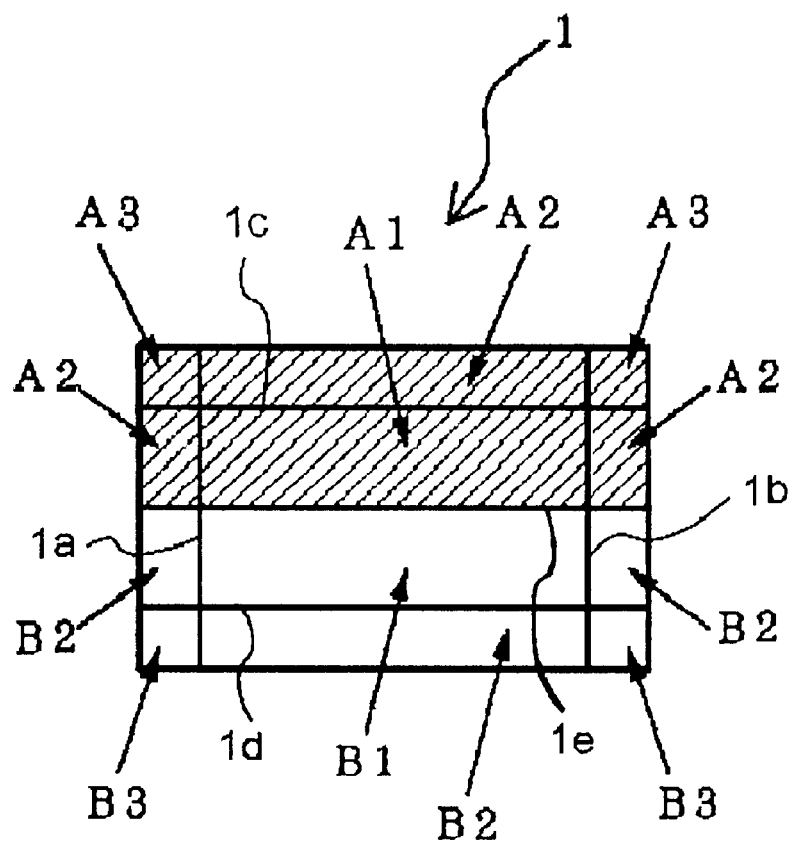
FIG. 1 is a plan view of a pattern of a mask used in an electron beam writing method in accordance with the first embodiment.

FIG. 1 illustrates a pattern to be applied to an electron beam lithography mask.

The illustrated pattern 1 is a rectangular pattern in a dynamic random access memory (DRAM). The pattern I is divided into a plurality of divisional patterns by four lines 1a, 1b, 1c and 1d in accordance with a pattern area density. Specifically, the pattern 1 is divided into internal patterns A1 and B1, side peripheral patterns A2 and B2, and corner patterns A3 and B3.

The pattern 1 is further divided into upper and lower halves by a center line 1e due to limitation in an effective irradiation area or exposed stripe area of an electron beam in an electron beam lithography apparatus.

The upper half includes the internal patterns A1, the side peripheral patterns A2, and the corner patterns A3. Similarly, the lower half includes the internal patterns B1, the side peripheral patterns B2, and the corner patterns B3. The pattern 1 is exposed into an electron beam first in one of the upper and lower halves, and then, in the other.

If the pattern 1 is not influenced by the limitation in an exposed stripe area, it would not be necessary to divide the pattern 1 into the upper and lower halves by the center line 1e.

Though the pattern 1 is divided into six patterns A1 to A3 and B1 to B3 in the first embodiment, it should be noted that the pattern 1 may be divided into any desired number of divisional patterns. In addition, all of the patterns A1 to A3 and B1 to B3 are rectangular in the first embodiment, they may have any desired shape. Only if the pattern 1 is divided into patterns in accordance with a pattern area density, the pattern 1 may be divided into divisional patterns by the desired number and in any desired shape.

Figure 2:
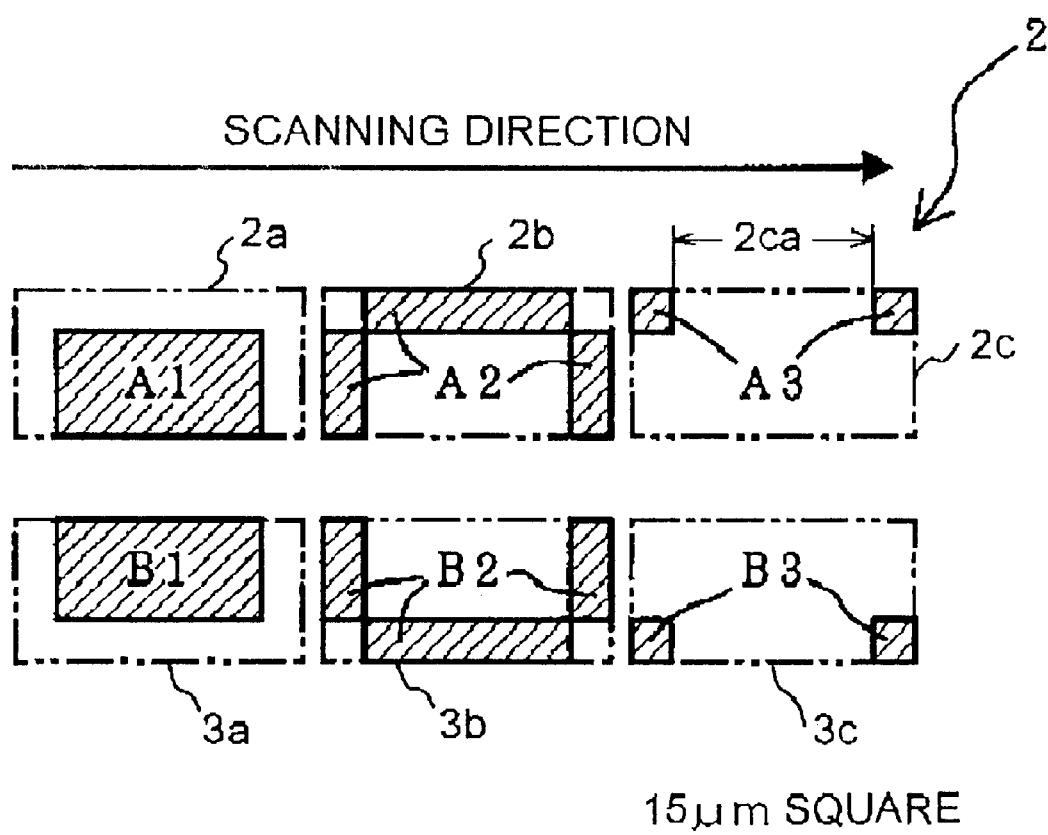
FIG. 2 is a plan view of a mask used in an electron beam writing method in accordance with the first embodiment.

As illustrated in FIG. 2, an electron beam lithography mask 2, which is called a SCALPEL mask, is designed to include areas 2a, 2b, 2c, 3a, 3b and 3c in each of which the divisional patterns A1, A2, A3, B1, B2 and B3 is formed, respectively.

In addition, the areas 2a to 2c are horizontally arranged in a line in a scanning direction, and the areas 3a to 3c are horizontally arranged in a line in a scanning direction below the areas 2a to 2c.

This arrangement ensures the mask 2 to move only in a direction when a wafer is to be exposed to an electron beam through the next area of the mask 2. Thus, it would be possible to shorten a cycle time, ensuring enhancement of a fabrication yield.

It should be noted that the arrangement of the divisional patterns A1, A2 and A3 is shown as an example, and that the divisional patterns A1, A2 and A3 may be arranged in other orders.

By dividing the pattern 1 into the divisional patterns A1 to A3 and B1 to B3 in accordance with a pattern area density, and forming the areas 2a to 2c and 3a to 3c in the mask 2, including those divisional patterns A1 to A3 and B1 to B3, respectively, it would be possible to expose a wafer into an electron beam through each of the divisional patterns at an optimal scanning rate, ensuring that the proximity effect can be compensated for with high accuracy.

If the divisional pattern A3 had a relatively small pattern area density, for instance, it would be preferable to design the divisional pattern A3 to have such an area as the proximity effect can be effectively compensated for.

Specifically, it is preferable that the divisional pattern A3 is shaped in a square having a side length of Y/2 wherein Y indicates a backscattering diameter βb in a double Gaussian distribution model equation. For instance, if the backscattering diameter βb is equal to 30 micrometers, it is preferable that the divisional pattern A3 is designed to be a square having a side length of about 15 micrometers.

By determining an area of each of the divisional patterns A1 to A3 and 1 to B3 in the above-mentioned manner, it would be possible to compensate for the proximity effect.

Hereinbelow is explained an electron beam writing method in which the above-mentioned electron beam lithography mask is used.

Figure 3:
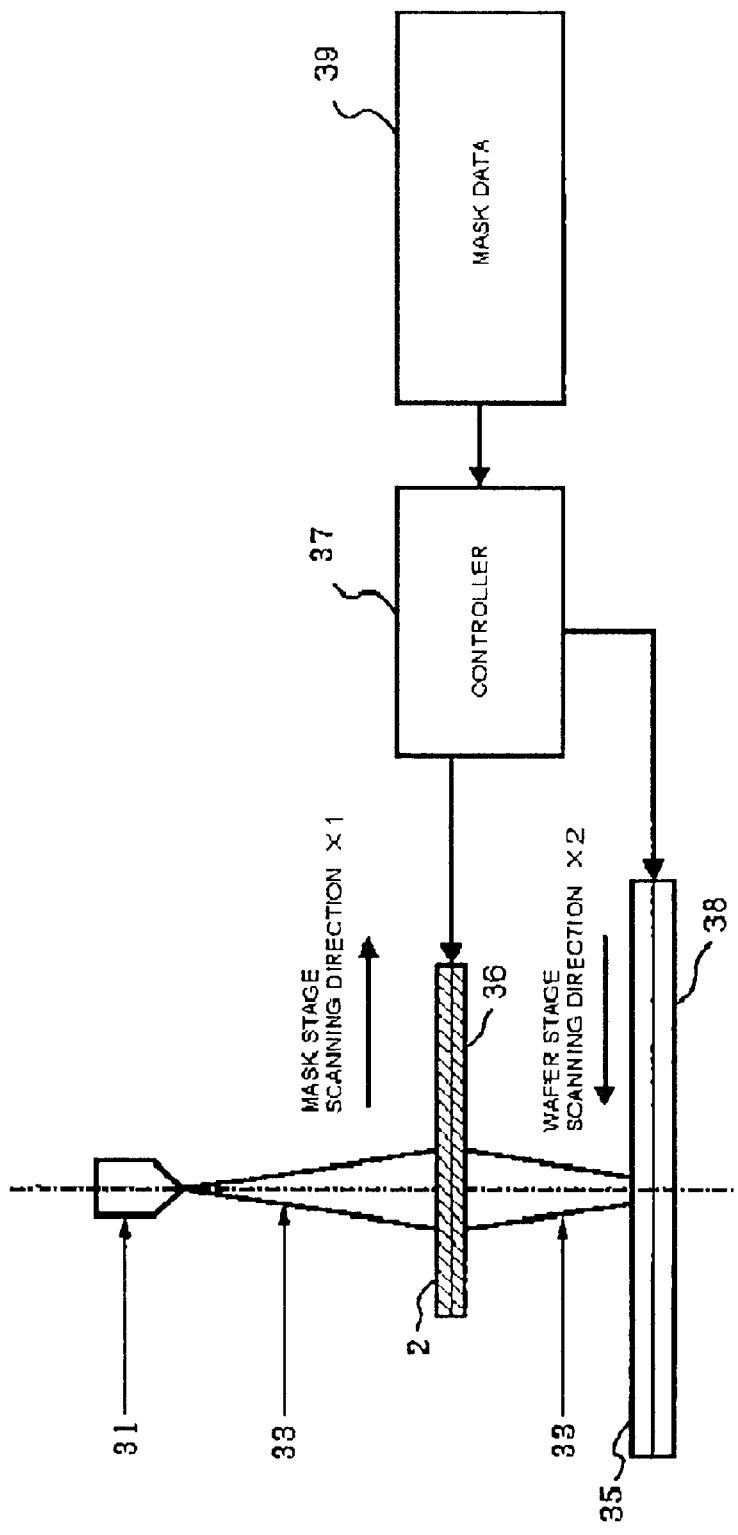
FIG. 3 is a side view of an electron beam lithography apparatus to carry out the electron beam writing method in accordance with the first embodiment.

FIG. 3 illustrates an electron beam lithography apparatus for carrying out the electron beam writing method.

The illustrated apparatus is comprised of an electron beam gun 31 emitting an electron beam 33, a wafer stage 38 on which a wafer 35 is to be mounted and which is horizontally movable, the above-mentioned electron beam lithography mask 2 located between the electron beam gun 31 and the wafer 35, a mask stage 36 on which the mask 2 is mounted and which horizontally movable above the wafer stage 38, and a controller 37 which controls a speed of both the mask stage 36 and the wafer stage 38 for each of the divisional patterns A1 to A3 and B1 to B3 of the mask 2 in accordance with mask data 39 including a pattern area density.

An operation of the electron beam lithography apparatus is explained hereinbelow.

The electron beam 33 emitted from the electron beam gun 31 passes through the mask 2, and reaches the wafer 35.

The mask 2 and the wafer 35 are first located at a predetermined position. While the wafer 35 is exposed to the electron beam 33, the mask stage 36 on which the mask 2 lies and the wafer stage 38 on which the wafer 35 lies are moved at a constant speed in scanning directions X1 and X2, respectively. In the present embodiment, the controller 37 controls a scanning speed of the mask stage 36 and the wafer stage 38 for each of the divisional patterns A1 to A3 and B1 to B3 of the mask 2 in accordance with the mask data 39, specifically, the pattern area density.

As is obvious in view of FIG. 2, the divisional pattern A1 has a greater area density than the area densities of the divisional patterns A2 and A3, and the divisional pattern A2 has a greater area density than the area density of the divisional pattern A3.

When the wafer 35 is exposed to the electron beam 33 through the divisional pattern A1 having the greatest area density among the divisional patterns A1 to A3, the controller 37 moves both the mask stage 36 and the wafer stage 35 at a smallest scanning rate. Hence, even if the divisional pattern A1 had a great area density, it would be possible to compensate for the proximity effect.

By controlling a speed of the stages 36 and 38 in the above-mentioned manner, a fabrication yield of the wafer 35 can be enhanced.

First, the wafer 35 is exposed to the electron beam 33 through the divisional pattern Al of the mask 2.

After moving the wafer stage 38 back in a direction opposite to the direction X2, the wafer 35 is exposed to the electron beam 33 through the divisional pattern A2 of the mask 2 at a scanning speed smaller than the scanning speed at which the wafer 35 was exposed to the electron beam 33 through the divisional pattern A1.

Thus, it is possible to compensate for the proximity effect in accordance with an area density of the divisional pattern A2.

After moving the wafer stage 38 back in a direction opposite to the direction X2, the wafer 35 is exposed to the electron beam 33 through the divisional pattern A3 of the mask 2 at a scanning speed smaller than the scanning speed at which the wafer 35 was exposed to the electron beam 33 through the divisional pattern A2.

Thus, it is possible to compensate for the proximity effect in accordance with an area density of the divisional pattern A1. In addition, it is possible to locally increase a scanning speed, which compensates for deterioration in a fabrication yield, caused by divisional exposure in which the wafer 35 is exposed into the electron beam 33 through each of the divisional patterns A1 to A3 and B1 to B3.

As illustrated in FIG. 2, the divisional patterns A3 is formed at opposite corners in the area 2c. Hence, though the mask stage 36 and the wafer stage 38 are moved at a low speed by the controller 37 while the wafer 35 is exposed to the electron beam 33 through the divisional pattern A3, the mask stage 36 and the wafer stage 38 are moved at a high speed by the controller 37 when the stages 36 and 38 are moving above a space 2ca located between the divisional patterns A3 in the area 2c.

In addition, since the divisional patterns A1 to A3 are arranged in a line in the scanning direction, it is unnecessary for the mask stage 36 to wastefully move, avoiding an increase in a cycle time.

From the standpoint of a fabrication yield, it is preferable that the divisional pattern A2 is formed as a reflected image relative to an original divisional pattern, and that the wafer 35 is exposed to the electron beam 33 through the divisional pattern A2 when the wafer stage 38 is moved back in a direction opposite to the scanning direction X2.

Figure 4:
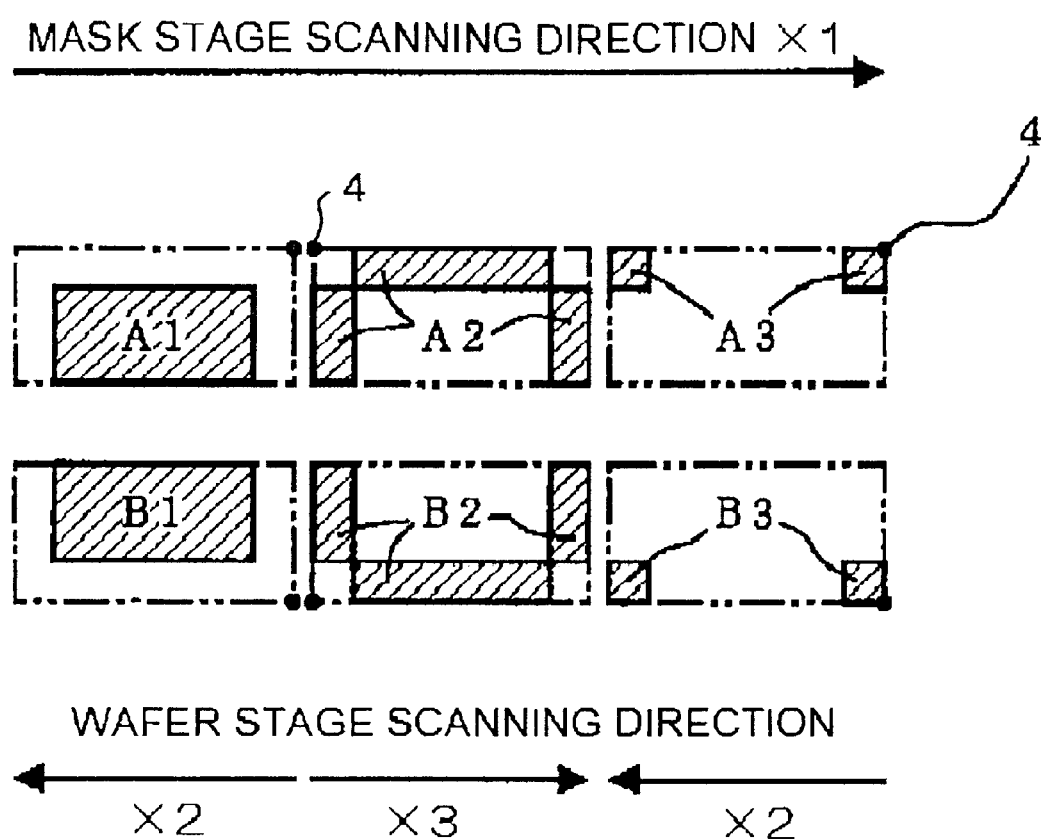
FIG. 4 is a plan view of a mask used in an electron beam writing method in accordance with a variant of the first embodiment.

Thus, as illustrated in FIG. 4, a hypothetical origin 4 of the divisional pattern A2 is located backward relative to the scanning direction X1 of the mask stage 36. As a result, the wafer stage 38 may be moved in a direction X3 opposite to the direction X2 at which the wafer stage 38 is usually moved, ensuring it is possible to reduce a period of time necessary for the wafer stage 38 to move back, and hence, ensuring enhancement of a fabrication yield.

The operation mentioned above is detailed hereinbelow.

When the wafer 35 is exposed to the electron beam 33 through the divisional pattern A3, the controller 37 moves the mask stage 36 in the direction X1, and the controller 37 moves the wafer stage 38 in the direction X2 which is just opposite to the direction X1.

Then, when the wafer 35 is exposed to the electron beam 33 through the divisional pattern A2, the controller 37 moves the mask stage 36 in the direction X1, and the controller 37 moves the wafer stage 38 in the direction X3 which is just opposite to the direction X1. Thus, the wafer 35 can be successively exposed to the electron beam 33 without moving back the wafer stage 38.

Then, when the wafer 35 is exposed to the electron beam 33 through the divisional pattern A1, the controller 37 moves the mask stage 36 in the direction X1, and the controller 37 moves the wafer stage 38 in the direction X2.

By forming a divisional pattern in every second area among the areas of the mask 2 as a reflected image relative to an original divisional pattern, it would be possible to expose the wafer 35 to the electron beam 33 while the wafer stage 38 is successively reciprocating. This ensures that a time for the wafer stage 38 to wastefully move can be cancelled, and hence, a fabrication yield can be enhanced.

When the divisional patterns A1 to A3 are written onto the wafer 35, the mask 2 moves at the right of the electron gun 31. Hence, the mask stage 36 has to be moved to the left such that the mask 2 is located at the right of the electron gun 31, in order to form a pattern on other areas of the wafer 35.

Figure 5:
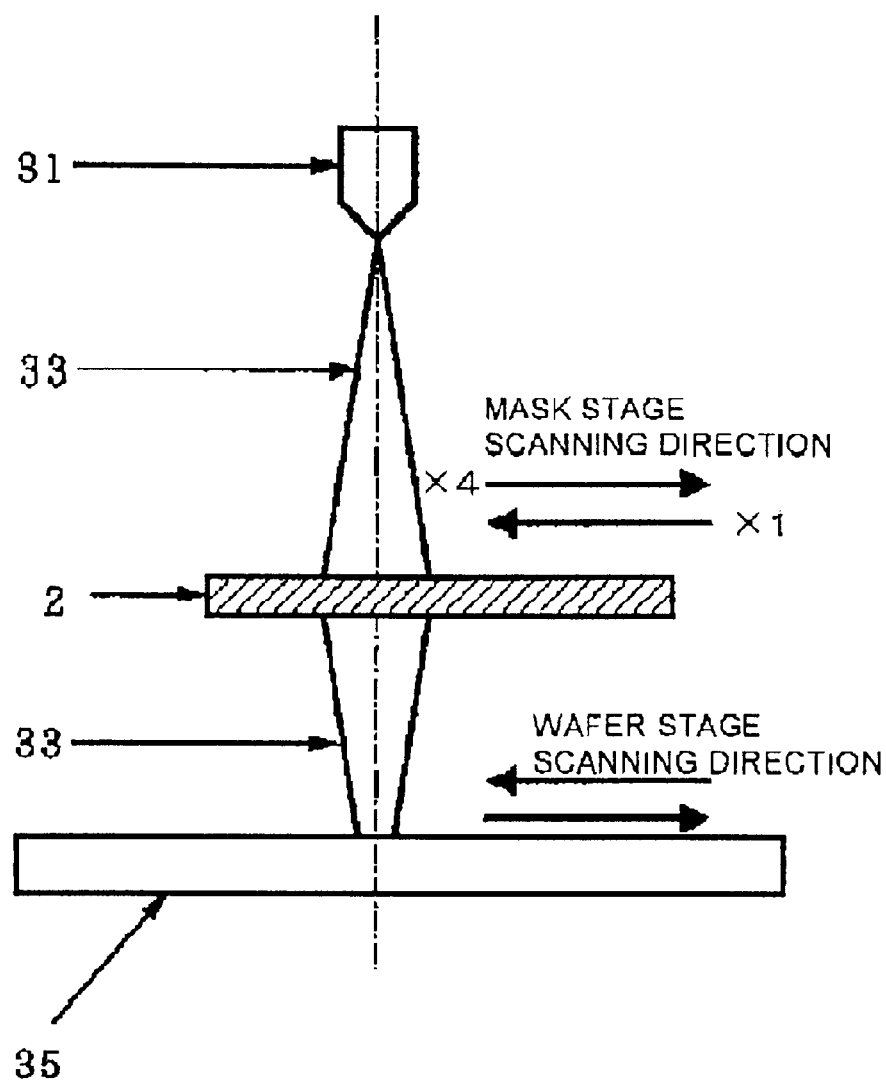
FIG. 5 is a side view of an electron beam lithography apparatus to carry out the electron beam writing method in accordance with a variant of the first embodiment.

To this end, as illustrated in FIG. 5, it is preferable that the wafer 35 is exposed to the electron beam 33 while the mask 2 is moved to the left, that is, in a direction X1.

Figure 6:
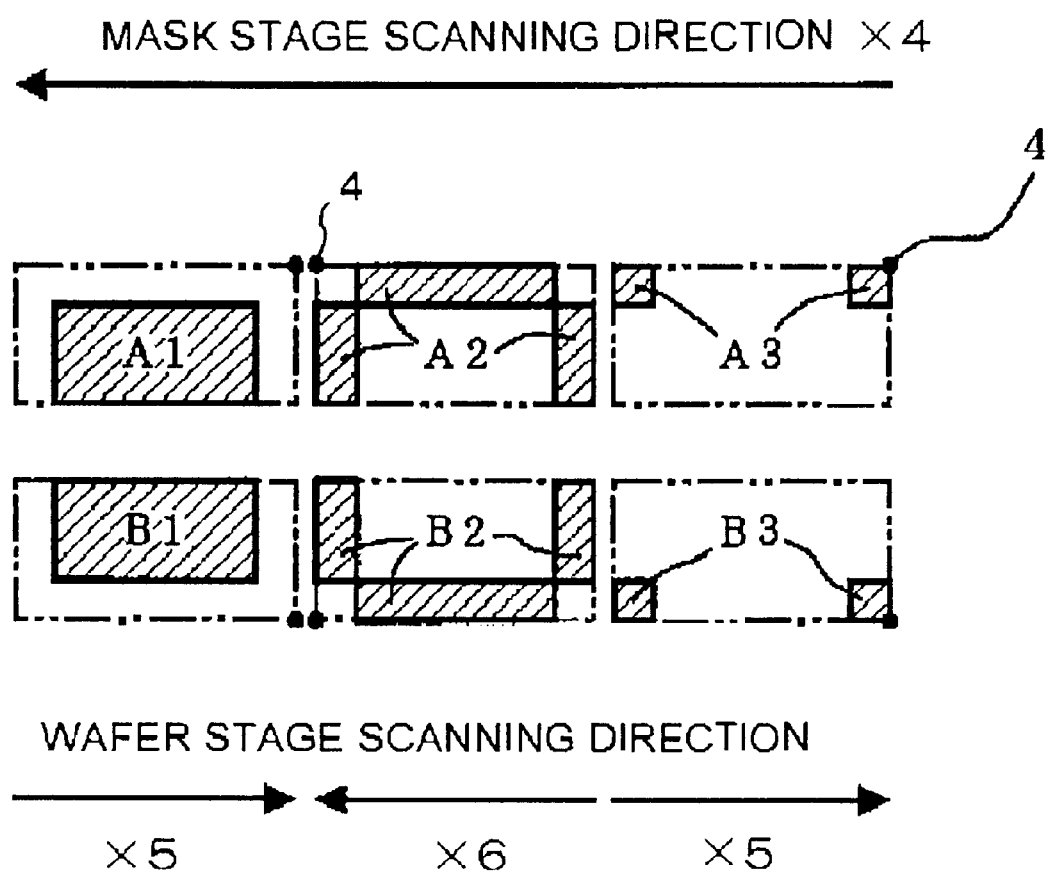
FIG. 6 is a plan view of a mask used in an electron beam writing method in accordance with another variant of the first embodiment.

Thus, as illustrated in FIG. 6, the wafer is exposed to the electron beam 33 while the mask 2 is moving in the direction X4 which is just opposite to the direction X1 illustrated in FIG. 4. This means that it is no longer necessary to move the mask 2 back to the right side of the electron gun 31, ensuring reduction in a time necessary for moving the mask stage 36.

Specifically, the wafer 35 is moved to a location at which the electron beam 33 is irradiated at an opposite side of a hypothetical origin of the area next to be exposed to the electron beam 33.

Then, the controller 37 moves the mask stage 36 and hence the mask 2 which is located at the right side of the electron gun 31, to the left side of the electron gun 31. While the mask 2 is moving, the electron beam 33 is irradiated to the wafer 35 through the mask 2.

That is, the wafer 35 is exposed to the electron beam 33 first through the divisional pattern A1, second through the divisional pattern A2, and then, through the divisional pattern A3. As illustrated in FIG. 6, when the wafer 35 is exposed to the electron beam 33 through the divisional pattern A1, the wafer stage 38 is moved to the right, that is, in a direction X5. When the wafer 35 is exposed to the electron beam 33 through the divisional pattern A2, the wafer stage 38 is moved to the left, that is, in a direction X6. When the wafer 35 is exposed to the electron beam 33 through the divisional pattern A3, the wafer stage 38 is moved to the right, that is, in the direction X5.

Thus, the wafer 35 is exposed to the electron beam 33 in a high fabrication yield.

An order in which the divisional patterns A1 to A3 and B1 to B3 are formed is not limited to the above-mentioned order. An order may be varied, unless the divisional patterns are arranged in the same scanning direction.

In the present embodiment, the mask 2 includes one set of the divisional patterns A1 to A3 or B1 to B3. However, it should be noted that the mask 2 may be designed to repeatedly include two or more sets of the divisional patterns. For instance, the mask 2 may include two sets of the divisional patterns, in which case, the divisional patterns A1, A2, A3, A1, A2 and A3 are arranged in the mask 2 in this order. By designing the mask 2 to include two or more sets of the divisional patterns, it would be possible to successively expose two regions in the wafer 35 to the electron beam 33.

As explained so far, in accordance with the present embodiment, there is prepared the mask 2 having the areas 2a to 2c and 3a to 3c in each of which the divisional patterns A1 to A3 and B1 to B3 is formed, respectively. Each of the divisional patterns A1 to A3 and B1 to B3 is obtained by dividing a pattern to be written, in accordance with an area density. The controller 37 exposes the wafer 35 to the electron beam 33 through the mask 2 such that a different amount of irradiation of electron beam is applied through each of the divisional patterns A1 to A3 and B1 to B3 of the mask 2.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-284512 filed on Oct. 5, 1999 including specification, claims, drawings and summary is incorporated herein by reference in its entirety.

What is claimed is:

1. An electron beam writing method comprising the steps of:
   (a) preparing a mask having areas in each of which a divisional pattern is formed, said divisional pattern being obtained by dividing a pattern to be written, in accordance with an area density; and
   (b) irradiating an electron beam onto a wafer through said mask such that a different amount of irradiation of electron beam is applied through each of said areas of said mask, wherein said areas are arranged in a line in said mask, a divisional pattern in every second area among said areas is formed as a reflected image relative to an original divisional pattern, and said wafer is reciprocated across each of said areas.

2. The electron beam writing method as set forth in claim 1, wherein said step (b) is carried out by varying a rate at which a stage on which said mask is mounted is moved.

3. The electron beam writing method as set forth in claim 1, wherein said step (b) is carried out by varying a rate at which a stage on which said wafer is mounted is moved.

4. The electron beam writing method as set forth in claim 1, wherein said mask is reciprocating within each of said areas in said step (b).

5. The electron beam writing method as set forth in claim 1, wherein said areas arranged in a line have divisional patterns to be scanned in the same direction.

6. The electron beam writing method as set forth in claim 1, wherein each of said areas is shaped in a square having a side length of Y/2 wherein Y indicates a backscattering diameter in a double Gaussian distribution model equation.

7. The electron beam writing method as set forth in claim 1, wherein said wafer is moved in a direction opposite to a direction in which said mask is moved.

8. The electron beam writing method as set forth in claim 1, wherein said mask has first to third areas in each of which first to third divisional patterns are formed, respectively, said first to third areas being arranged in a line in this order, said second divisional pattern being formed as a reflected image relative to an original divisional pattern, and
   said step (b) further includes the steps of:
      (b1) moving said mask in a first direction and said wafer in a second direction for exposing said third area with an electron beam, said first and second directions being opposite to each other;
      (b2) moving said mask in said first direction and said wafer in said first direction for exposing said second area with an electron beam; and
      (b3) moving said mask in said first direction and said wafer in said second direction for exposing said first area with an electron beam.

9. The electron beam writing method as set forth in claim 1, wherein said areas are repeatedly arranged in a group in said mask, said areas in a group having the same set of divisional patterns.

10. The electron beam writing method as set forth in claim 9, wherein a divisional pattern in every second area among said areas in each group is formed as a reflected image relative to an original divisional pattern.

* * * * *